US012707598B2

(12) United States Patent
Kim et al.

(10) Patent No.: US 12,707,598 B2
(45) Date of Patent: Aug. 11, 2026

(54) WIRELESS COMMUNICATION APPARATUS

(71) Applicant: KMW INC., Hwaseong-si (KR)

(72) Inventors: Duk Yong Kim, Yongin-si (KR); Kyo Sung Ji, Hwaseong-si (KR); Chi Back Ryu, Hwaseong-si (KR); Won Jun Park, Yongin-si (KR); Jun Woo Yang, Hwaseong-si (KR)

(73) Assignee: KMW INC., Hwaseong-si (KR)

( * ) Notice: Subject to any disclaimer, the term of this patent is extended or adjusted under 35 U.S.C. 154(b) by 183 days.

(21) Appl. No.: 18/444,683

(22) Filed: Feb. 17, 2024

(65) Prior Publication Data

US 2024/0196567 A1 Jun. 13, 2024

Related U.S. Application Data

(63) Continuation of application No. PCT/KR2022/012077, filed on Aug. 12, 2022.

(30) Foreign Application Priority Data

Aug. 18, 2021 (KR) ........................ 10-2021-0108902

(51) Int. Cl.
*H05K 7/20* (2006.01)
*H01Q 1/42* (2006.01)
(Continued)

(52) U.S. Cl.
CPC ............. *H05K 7/2039* (2013.01); *H01Q 1/42* (2013.01); *H05K 5/0247* (2013.01); *H05K 9/006* (2013.01)

(58) Field of Classification Search
CPC ........ H01Q 1/42; H01Q 1/1207; H01Q 1/405; H01Q 1/50; H01Q 9/0414; H05K 7/20409;
(Continued)

(56) References Cited

U.S. PATENT DOCUMENTS 4,371,757 A * 2/1983 Debortoli ................ H04Q 1/14
174/44
5,274,731 A * 12/1993 White .................. G02B 6/4455
385/139
(Continued)

FOREIGN PATENT DOCUMENTS

CN 210838048 U 6/2020
CN 211507901 U 9/2020
(Continued)

OTHER PUBLICATIONS

Lee Jae Hong, Repeater for radio communication, May 25, 2009 KR-20090051979-A PE2E translation (Year: 2009).*
(Continued)

*Primary Examiner* — Michael A Matey

(57) ABSTRACT

A wireless communication apparatus is disclosed. According to at least one embodiment of the present disclosure, a wireless communication apparatus including a main case; a random disposed on a front surface of the main case and forming an accommodation space therein; a heat dissipation portion disposed at a rear surface of the random; an upper screen disposed in contact with a rear end of an upper surface of the main case and having a plurality of first through holes formed therein; and a cover portion disposed on a rear surface of the main case, configured to be opened and closed, and having a plurality of second through holes formed therein.

12 Claims, 5 Drawing Sheets

(51) Int. Cl.
*H05K 5/02* (2006.01)
*H05K 9/00* (2006.01)

(58) Field of Classification Search
CPC ........... H05K 7/20154; H05K 7/20418; H05K 2201/10098; H05K 7/2039; H05K 1/0204; H05K 1/0243; H05K 1/142; H05K 1/145; H05K 2201/066; H05K 5/0221; H05K 5/0217; H05K 5/0226; H05K 5/023; H05K 5/0247; H05K 5/03; H05K 9/006; H05K 7/026; H05K 7/14; H05K 7/18; H05K 7/20; H04B 1/38; F24F 13/20; G06F 1/181; H01L 23/4093; H04Q 2201/10; H02B 1/48; H02B 1/012; H02B 1/26; H02K 5/18; H04R 1/02
See application file for complete search history.

(56) References Cited

U.S. PATENT DOCUMENTS

| | | | | |
|---|---|---|---|---|
| 6,628,521 | B2 * | 9/2003 | Gustine | H04Q 1/035 361/688 |
| 7,031,158 | B2 | 4/2006 | Leon et al. | |
| 8,004,844 | B2 * | 8/2011 | Kim | H05K 7/20163 361/728 |
| 8,497,813 | B2 * | 7/2013 | Rodger | H01Q 21/06 343/702 |
| 11,147,154 | B2 * | 10/2021 | Yoo | H01Q 21/00 |
| 2004/0185906 | A1 * | 9/2004 | Iwahashi | H04B 1/036 455/561 |
| 2004/0203528 | A1 * | 10/2004 | Ammar | H01Q 21/0087 455/90.3 |
| 2009/0310312 | A1 * | 12/2009 | Wayman | H05K 7/20418 361/709 |
| 2011/0032158 | A1 * | 2/2011 | Rodger | H01Q 1/246 343/702 |
| 2015/0037387 | A1 | 2/2015 | Coleman et al. | |
| 2015/0250022 | A1 * | 9/2015 | Kim | H05K 7/20545 455/561 |
| 2015/0267876 | A1 * | 9/2015 | Kim | F21V 21/30 362/235 |
| 2015/0285531 | A1 * | 10/2015 | Lee | F24F 1/022 62/271 |
| 2015/0308732 | A1 * | 10/2015 | Lee | F24F 3/14 62/291 |
| 2015/0373871 | A1 * | 12/2015 | Lv | H05K 5/023 455/561 |
| 2017/0345346 | A1 * | 11/2017 | Hong | G09F 9/30 |
| 2018/0019769 | A1 * | 1/2018 | Hu | H04B 1/036 |
| 2022/0200125 | A1 * | 6/2022 | Ji | F28F 3/12 |

FOREIGN PATENT DOCUMENTS

| | | |
|---|---|---|
| KR | 10-2009-0051979 A | 5/2009 |
| KR | 10-2010-0086656 A | 8/2010 |

OTHER PUBLICATIONS

Yahata Yusuke, JP2018064205, Active Antenna System and Signal Processing Module, Apr. 19, 2018, PE2E Search (Year: 2018).*

Xu Yongjie, WO 2019236203 A2, Base Station Antennas Having Fully Embedded Radios and Housings With Integrated Heat Sink Structures, Dec. 12, 2019, PE2E Search (Year: 2019).*

European Search Report dated Jul. 11, 2025 from European Patent Office for Application No. 22858684.8.

International Search Report mailed Nov. 24, 2022 for International Application No. PCT/KR2022/012077 and its English translation.

Korean Office Action mailed on Nov. 13, 2025 from Ministry of Intellectual Property for Application No. 10-2021-0108902.

Office Action mailed on Mar. 26, 2026 from State Intellectual Property Office for Application No. 202280051743.4 and its English translation.

* cited by examiner

[Fig. 2]
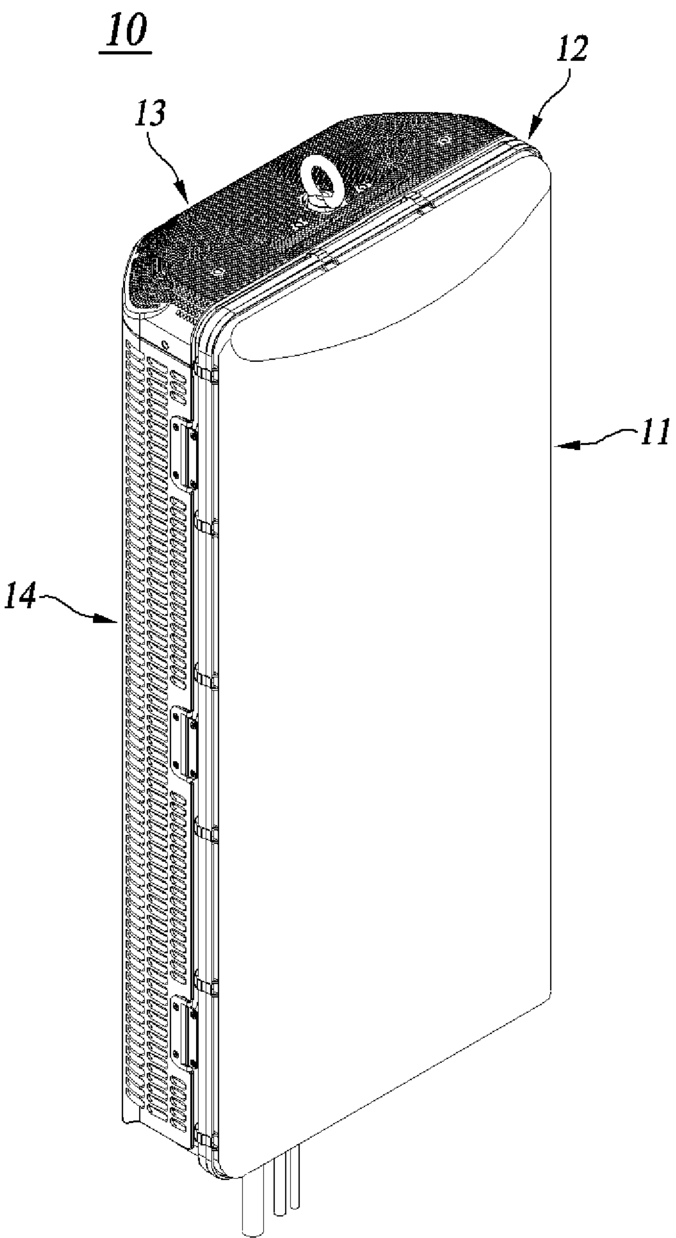

[Fig. 6]
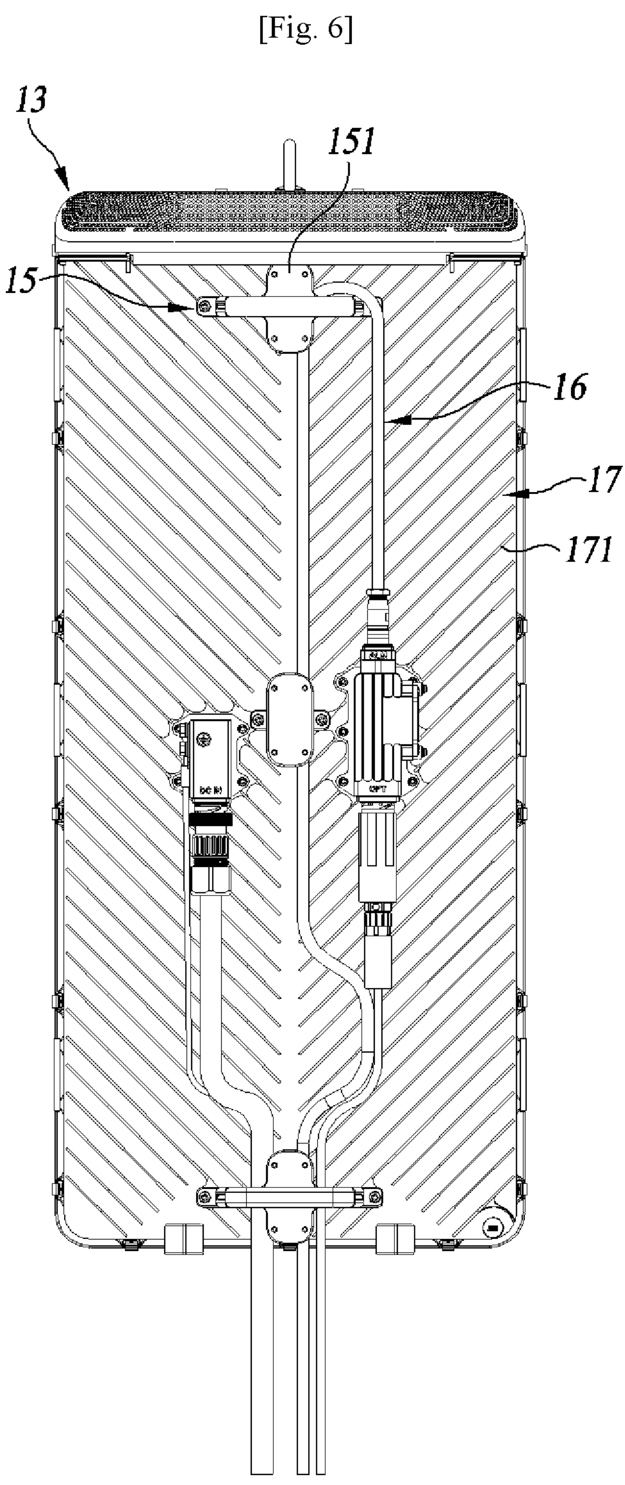

WIRELESS COMMUNICATION APPARATUS

CROSS-REFERENCE TO RELATED APPLICATIONS

This application is a continuation application of International Application No. PCT/KR2022/012077, filed on Aug. 12, 2022, which claims the benefit of Korean Patent Application No. 10-2021-0108902, filed Aug. 18, 2021, in the Korean Intellectual Property Office, the disclosures of which are incorporated herein in their entirety by reference.

TECHNICAL FIELD

The present disclosure relates to a wireless communication apparatus.

BACKGROUND ART

The content described in this section simply provides background information for the present disclosure and does not constitute related art.

A wireless communication apparatus used to transmit and receive radio signals is generally installed in an outdoor environment, such as a roof of a building. A heat dissipation portion disposed at a rear surface of the wireless communication apparatus to radiate heat generated by a heating element disposed inside the wireless communication apparatus to the outside is generally disposed to be open. When the wireless communication apparatus is installed, aesthetics of the building are often damaged due to the heat dissipation portion, cables extending to a lower end of the wireless communication apparatus, or the like.

Research is being conducted in various fields to improve a size and design of the wireless communication apparatus so that the aesthetics of the building are not damaged, but improvements in design and size are limited in terms of maintenance of functions of the wireless communication apparatus.

When a screen for screening the heat dissipation portion is installed in order to improve aesthetics of the wireless communication apparatus, there is a problem that the performance of the wireless communication apparatus is degraded because heat generated from the heat dissipation portion is not radiated to the outside.

DETAILED DESCRIPTION OF INVENTION

Technical Problems

A wireless communication apparatus according to an embodiment can have aesthetics of the wireless communication apparatus improved by providing an apparatus that can screen a heat dissipation portion and cables.

The wireless communication apparatus according to an embodiment can radiate heat to the outside using a heat dissipation portion and block sunlight coming from the outside by providing an upper screen having through holes and an opening and closing portion.

The wireless communication apparatus according to an embodiment can have convenience of maintenance of the wireless communication apparatus improved by providing a cover portion that can be opened and closed at a rear surface.

The problems to be solved by the present disclosure are not limited to the problems mentioned above, and other problems not mentioned can be clearly understood by those skilled in the art from the description below

Technical Solution

According to at least one embodiment of the present disclosure, a wireless communication apparatus including a main case; a radome disposed on a front surface of the main case and forming an accommodation space therein; a heat dissipation portion disposed at a rear surface of the radome; an upper screen disposed in contact with a rear end of an upper surface of the main case and having a plurality of first through holes formed therein; and a cover portion disposed on a rear surface of the main case, configured to be opened and closed, and having a plurality of second through holes formed therein.

A thickness of the upper screen may be equal to or larger than twice a diameter of the first through hole.

The plurality of first through holes may have a circular or oval cross-section.

The plurality of first through holes may be formed to penetrate the upper screen in a direction parallel to a longitudinal direction of the heat dissipation portion.

The plurality of first through holes may be formed to penetrate the upper screen at an angle to a longitudinal direction of the heat dissipation portion.

The wireless communication apparatus may further include one or more vertical rotation shafts located on at least one of left and right sides of the wireless communication apparatus so that the cover portion is opened and closed by pivoting around the vertical rotation shaft.

At least a portion of the upper screen may have a horizontal surface, and at least another portion of the upper screen may have a downward slope to the outer side.

The antenna apparatus may further include a fixing portion configured to fix the cover portion in an opened state when the cover portion is opened.

The fixing portion may include a locking portion configured to fit into an inner wall of the cover portion, the locking portion being formed at a free end.

The wireless communication apparatus may further comprise a handle portion formed to protrude to the outside through at least a portion of the cover portion, wherein an opening corresponding to a disposition position and shape of the handle portion is formed in the cover portion.

The handle portion may further include a handle support portion located on an inner side of the cover portion and disposed to support the position of the handle portion.

The wireless communication apparatus may further comprise a cable disposed between the cover portion and the heat dissipation portion, wherein a portion of the cable is hung on the handle support portion.

Effect of Invention

According to an embodiment, there is an effect that it is possible to improve aesthetics of the wireless communication apparatus by providing the upper screen and the cover portion so that the heat dissipation portion and the cables are invisible from the outside.

According to an embodiment, there is an effect that it is possible to maintain or improve a heat dissipation effect by the wireless communication apparatus including a component for screening the heat dissipation portion so that the heat dissipation portion is not exposed to the outside, and through holes through which heat can be radiated.

BRIEF DESCRIPTION OF THE DRAWING

FIG. 1 is a rear perspective view of a wireless communication apparatus according to an embodiment of the present disclosure.

FIG. 2 is a front perspective view of the wireless communication apparatus according to an embodiment of the present disclosure.

FIG. 6 is a rear view of the wireless communication apparatus according to an embodiment of the present disclosure.

BEST MODE FOR CARRYING OUT THE INVENTION

Figure 3:
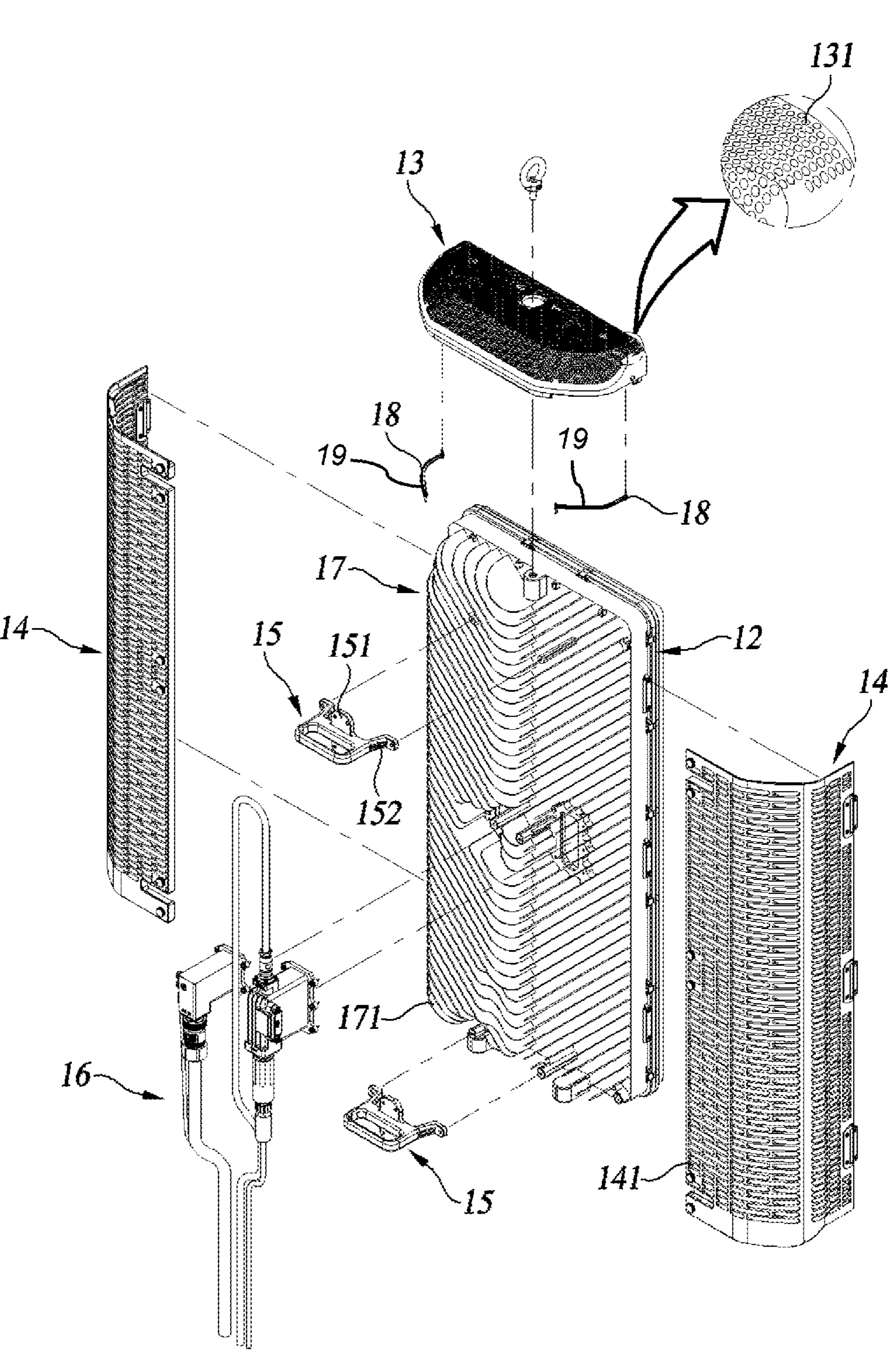
FIG. 3 is an exploded perspective view of the wireless communication apparatus according to an embodiment of the present disclosure.

Hereinafter, some embodiments of the present disclosure will be described in detail with reference to the accompanying illustrative drawings. In the following description, like reference numerals preferably designate like elements, although the elements are shown in different drawings. Further, in the following description of some embodiments, a detailed description of related known components and functions when considered to obscure the subject of the present disclosure will be omitted for the purpose of clarity and for brevity.

Additionally, various ordinal numbers or alpha codes such as first, second, i), ii), a), b), etc., are prefixed solely to differentiate one component from the other but not to imply or suggest the substances, order, or sequence of the components. Throughout this specification, when a part "includes" or "comprises" a component, the part is meant to further include other components, not to exclude thereof unless specifically stated to the contrary.

Figure 1:
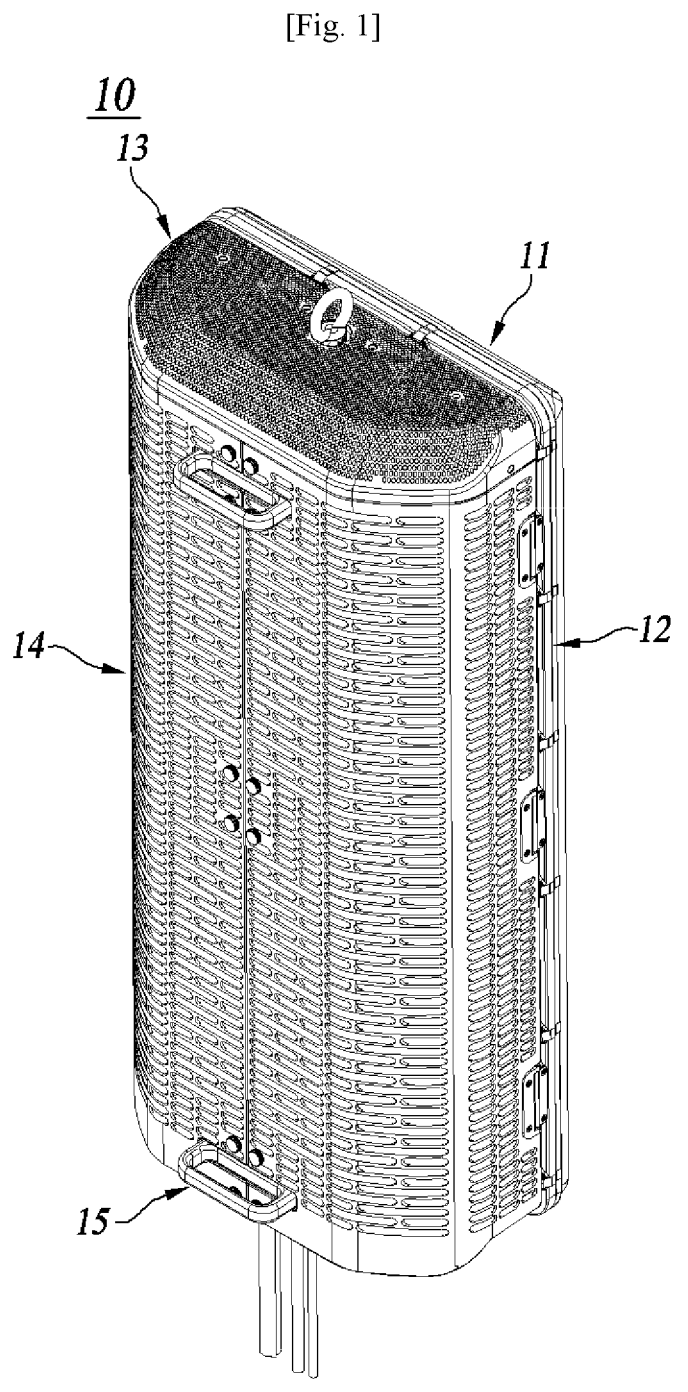

FIG. 1 is a rear perspective view of a wireless communication apparatus according to an embodiment of the present disclosure.

FIG. 2 is a front perspective view of the wireless communication apparatus according to an embodiment of the present disclosure.

FIG. 3 is an exploded perspective view of the wireless communication apparatus according to an embodiment of the present disclosure. Referring to FIGS. 1 to 3, a wireless communication apparatus 10 may include all or some of a main case 12, a radome 11, a heat dissipation portion 17, an upper screen 13, a cover portion 14, and a handle portion 15.

The main case 12 may form an accommodation space that opens forward, and may be formed to have a small front-to-back accommodation width over a substantially vertical length. The main case 12 may be formed in a rectangular parallelepiped shape.

The radome 11 may be disposed on a front surface of the main case 12. The radome 11 may shield the accommodation space, be made of a material that allows electromagnetic waves to penetrate, and be fixed and disposed on the front side of the main case 12.

The accommodation space may be formed between the radome 11 and the main case 12. A plurality of heating elements may be disposed in the accommodation space. For example, a PA (Power Amplifier) element, a semiconductor element for RFIC, or a Low Noise Amplifier (LNA) element may be disposed as the heating element in the accommodation space. Here, the PA element is a transistor that is a main heat generation component of a high-frequency power amplifier, and is an RF element with high output power, and generates a large amount of heat as compared to an RFIC semiconductor element or LNA element.

While the wireless communication apparatus 10 operates, the heating element continuously generates heat, and the heat dissipation portion 17 disposed on a rear surface of the radome 11 radiates the heat from the accommodation space to the outside. In the heat dissipation portion 17, a plurality of heat dissipation fins 171 are formed to protrude from an opposite side of the accommodation space. The plurality of heat dissipation fins 171 have a maximized surface area that is in contact with the outside, thereby improving heat dissipation efficiency. The heat dissipation portion 17 may be integrally configured to cover the entire rear surface of the accommodation space, but the present disclosure is not limited thereto and one heat dissipation portion 17 may be disposed on each of the left and right sides, as illustrated in FIG. 3.

The upper screen 13 may be disposed in contact with a rear end of an upper surface of the main case, and have a plurality of first through holes 131 formed therein. The first through hole 131 may have a cross-section having any shape (for example, a circular or oval shape). Hereinafter, a case in which the first through hole 131 has a circular shape will be described as an example.

The upper screen 13 may be disposed close to a rear upper end of the heat dissipation portion 17, and heat generated from the plurality of heat dissipation fins 171 may be radiated through the plurality of first through holes 131 of the upper screen 13. Further, areas other than the plurality of first through holes 131 in the upper screen 13 may be made of a material that does not allow sunlight to pass through or reflects the sunlight. Therefore, the upper screen 13 serves as a screen so that the heat dissipation portion 17 is not directly irradiated with sunlight. That is, the upper screen 13 may be configured to prevent the heat dissipation portion 17 from being direct exposed to the sunlight and radiate heat generated in the heat dissipation portion 17 to the outside.

Figure 4:
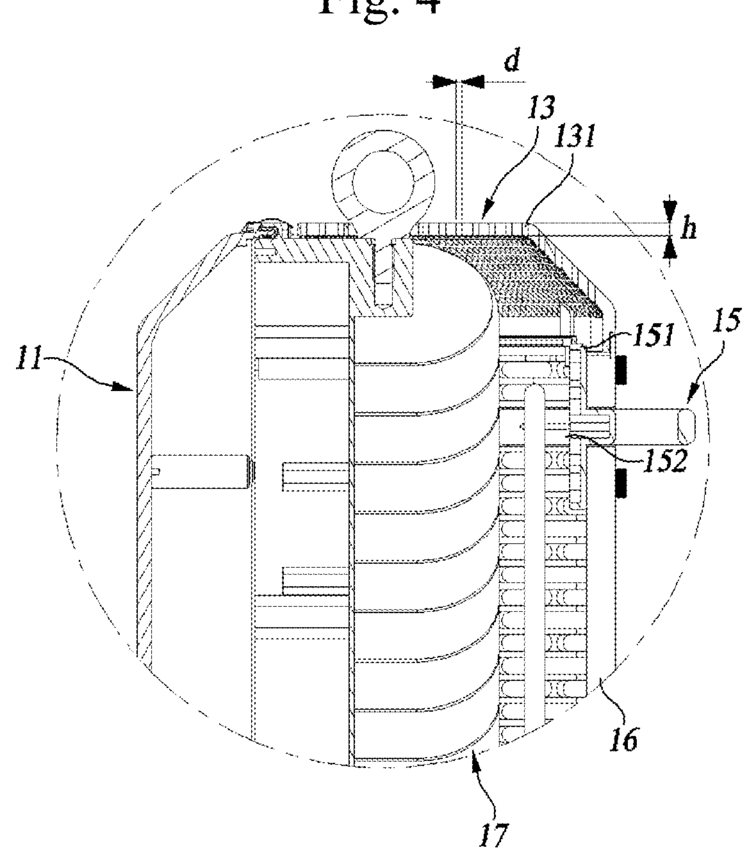
FIG. 4 is a side cross-sectional view of the wireless communication apparatus according to an embodiment of the present disclosure.

FIG. 4 is a side cross-sectional view of the wireless communication apparatus according to an embodiment of the present disclosure. Referring to FIG. 4, the upper screen 13 may be formed with a large thickness h to minimize an amount of sunlight with which the inside is irradiated. For example, a thickness h of a plurality of upper screens 13 may be equal to or larger than twice a diameter d of the first through hole 131. The first through hole 131 may be formed to penetrate the upper screen 13 in a direction parallel to a longitudinal direction of the heat dissipation portion 17.

The thickness of the upper screen 13 and the penetration direction of the first through hole 131 makes it possible to block the sunlight so that the inside is not irradiated with light other than light close to the penetration direction of the first through hole 131. That is, the upper screen 13 according to an embodiment of the present disclosure can radiate internal heat generated by the heat dissipation portion 17 to the outside and minimize an amount of sunlight from the outside that is radiated to the inside, thereby increasing a heat dissipation effect.

The penetration direction of the first through hole 131 is not limited thereto, and the first through hole 131 may be formed to penetrate the upper screen 13 at an angle to the longitudinal direction of the heat dissipation portion 17. The upper screen 13 may be configured to be detachable and to be able to be assembled, and the upper screen 13 having the first through hole 131 penetrating in a direction in which sunlight is blocked as much as possible depending on a disposition direction of the wireless communication apparatus 10 may be appropriately assembled so that sunlight blocking efficiency can be maximized.

The upper screen 13 may be disposed such that one end thereof is in contact with the rear end of the upper surface of the main case 12 and the other end thereof is in contact with an upper end of the cover portion 14. At least a portion of the upper screen 13 may have a horizontal surface, and at least another portion may have a downward slope to the outer side. Here, the outer side is the cover portion 14 side. That is, a portion of the upper screen 13 adjacent to the main case 12 has the horizontal surface, and a portion adjacent to the cover portion 14 has a downward inclined surface. Since the upper screen 13 has the downward inclined surface, the heat generated in the heat dissipation portion 17 can be radiated to the outside more efficiently.

The cover portion 14 is disposed on a rear surface of the main case 12, is configured to be opened and closed, and has a plurality of second through holes 141 formed therein. The cover portion 14 can protect the cable 16 and the heat dissipation portion 17 disposed inside from external shock. Additionally, the cover portion is disposed on the rear surface of the main case 12, and the cable extended and disposed at a lower end of the wireless communication apparatus 10 of the related art is moved to a space between the cover portion 14 and the heat dissipation portion 17, thereby improving the aesthetics of the wireless communication apparatus 10. Although the plurality of second through holes 141 are formed in the cover portion 14, the plurality of second through holes 141 may be formed so that the heat dissipation portion 17 and the cable 16 are invisible from the outside. The second through holes 141 may be used as a passage for radiating the heat generated in the heat dissipation portion 17 to the outside, similar to the first through holes 131.

Figure 5:
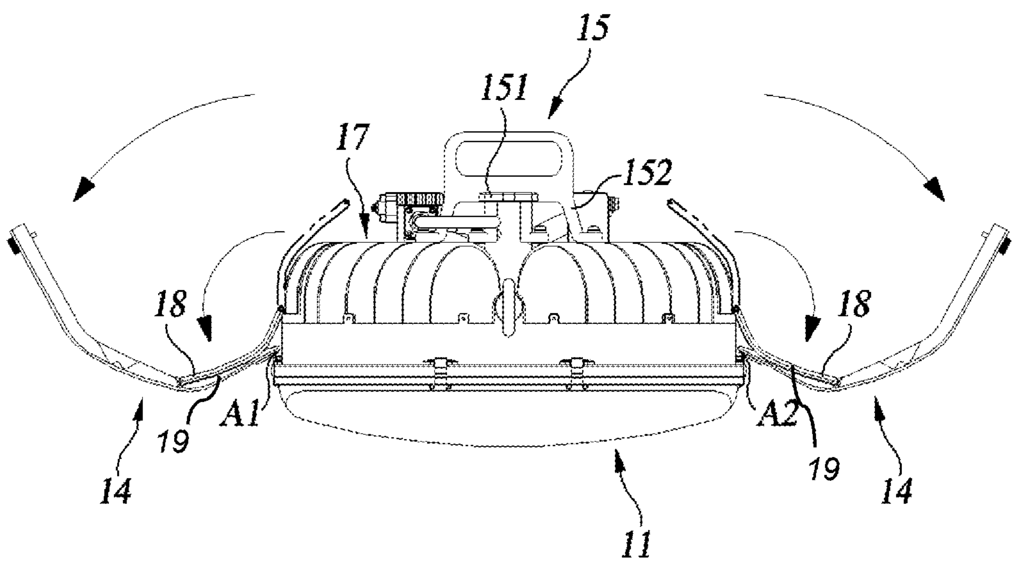
FIG. 5 is a plan view of the wireless communication apparatus according to an embodiment of the present disclosure.

FIG. 5 is a plan view of the wireless communication apparatus according to an embodiment of the present disclosure.

Referring to FIG. 5, the cover portion 14 may be opened and closed by pivoting around a vertical rotation shaft A1 or A2 located on at least one of left and right sides of the wireless communication apparatus 10. In FIG. 5, the upper screen 13 is omitted for convenience of description. As illustrated in FIG. 5, the cover portion 14 may include two portions and may be opened and closed by pivoting around the vertical rotation shaft A1 located on the left side of the wireless communication apparatus 10 and the vertical rotation shaft A2 located on the right side of the wireless communication apparatus 10. However, the present disclosure is not limited thereto, and the cover portion 14 may include one cover portion 14 that covers the entire rear surface of the heat dissipation portion 17 and be opened and closed by pivoting around the vertical rotation shaft A1 or A2 located on one of the left and right sides of the wireless communication apparatus 10. In addition, opening and closing methods that may be modified by those skilled in the art fall within the scope of the present invention.

The cover portion 14 may have a generally arc-shaped cross-sectional structure, but is not limited thereto and may have any shape as long as the shape can provide a sufficient space to dispose cables between the heat dissipation portion 17 and the cover portion 14. Since the heat dissipation fins 171 of the heat dissipation portion 17 have a high temperature when the wireless communication apparatus 10 is in operation, there is a risk of a burn if the heat dissipation fins 171 are exposed to the outside when a worker or the like performs maintenance of a plurality of wireless communication apparatuses 10 at a place at which the plurality of wireless communication apparatuses 10 are installed. In the present disclosure, there is an effect that it is possible to protect the worker from such a burn risk by additionally providing the cover portion 14. That is, the cover portion 14 may serve as a finger guard.

The fixing portion 18 is configured to fix the cover portion 14 in an opened state when the cover portion 14 is opened. A locking portion 19 may be formed to protrude at a free end of the fixing portion 18. The locking portion 19 is configured to fit into a portion of an inner wall of the cover portion 14 in a state in which the cover portion 14 is opened. A fitting groove may be formed at a position corresponding to the locking portion 19 on the inner wall of the cover portion 14. When the cover portion 14 is opened and the wireless communication apparatus 10 is subjected to maintenance, the fixing portion 18 can prevent the cover portion 14 from being closed due to wind, or the like.

The handle portion 15 may be disposed to protrude to the outside through at least a portion of the cover portion 14. Accordingly, an opening corresponding to a position and shape of the handle portion 15 may be formed in the cover portion 14. At least one handle portion 15 may be disposed in the wireless communication apparatus 10, and may be disposed in an upper or lower portion of the rear surface of the wireless communication apparatus 10, as illustrated in the drawing. The handle portion 15 may serve as a handle when the wireless communication apparatus 10 is carried.

In addition, the handle portion 15 may also serve as a guide that guides a movement of the cover portion 14 when the cover portion 14 is closed. When the wireless communication apparatus 10 is laid down so that the rear surface of the wireless communication apparatus 10 is directed to a floor, the handle portion 15 may also serve as a support.

A fixing surface 151 for maintaining a closed state when the cover portion 14 is closed may be formed in the handle portion 15. After the wireless communication apparatus 10 is subjected to maintenance and then the cover portion 14 is closed, the closed state of the cover portion 14 can be stably maintained by screw coupling or magnetic coupling between at least a portion of the cover portion 14 and the fixing surface 151.

The handle portion 15 further includes a handle support portion 152 located on an inner side of the cover portion 14 and disposed to support a position of the handle portion 15. One end of the handle support portion 152 may be coupled to the main case 12 and/or the heat dissipation portion 17. For example, the one end of the handle support portion 152 may be screwed to a coupling portion formed on the heat dissipation portion 17. Since a portion of the handle support portion 152 is disposed between the cover portion 14 and the heat dissipation portion 17, the internal cable 16 may be arranged using the portion of the handle support portion 152. The cable 16 hung on the handle support portion 152 does not affect a disposition form of the wireless communication apparatus 10 even when the wireless communication apparatus 10 is disposed uprightly in the longitudinal direction. That is, cables protruding from a lower portion of the wireless communication apparatus 10 in the related art may be disposed on the inner side of the cover portion 14 so that the cables are invisible from the outside, and a disposition form of the cable may be fixed using the handle support portion 152.

FIG. 6 is a rear view of the wireless communication apparatus according to an embodiment of the present disclosure.

Referring to FIG. 6, when the wireless communication apparatus 10 is installed uprightly in the longitudinal direction, the cable 16 moves downward due to gravity. Therefore, a separate support portion or the like is required in order to fixedly position the cable 16 on the inner side the cover portion 14 and the heat dissipation portion 17. In FIG. 6, a configuration of the cover portion 14 is omitted for convenience of description. According to an embodiment of the present disclosure, it is possible to achieve efficient space utilization for arrangement of the cable 16 by hanging the cable 16 on the handle support portion 152 of the handle portion 15 disposed in an upper portion of the wireless communication apparatus 10. In addition, since the cable 16 is fixed by being hung on the handle support portion 152, it is possible to prevent a phenomenon in which the cable 16 flows to the outside when the cover portion 14 is opened in order to perform maintenance of the wireless communication apparatus 10.

Although exemplary embodiments of the present disclosure have been described for illustrative purposes, those skilled in the art will appreciate that various modifications, additions, and substitutions are possible, without departing from the idea and scope of the claimed invention. Therefore, exemplary embodiments of the present disclosure have been described for the sake of brevity and clarity. The scope of the technical idea of the embodiments of the present disclosure is not limited by the illustrations. Accordingly, one of ordinary skill would understand the scope of the claimed invention is not to be limited by the above explicitly described embodiments but by the claims and equivalents thereof.

REFERENCE NUMERALS

10: wireless communication apparatus 11: radome
12: main case 13: upper screen
14: cover portion 15: handle portion
16: internal cable 17: heat dissipation portion
18: fixing portion

What is claimed is:

1. A wireless communication apparatus comprising:

a main case;

a radome disposed on a front surface of the main case and forming an accommodation space therein;

a heat dissipation portion disposed at a rear surface of the radome;

an upper screen disposed on and in contact with a rear end of an upper surface of the main case and having a plurality of first through holes formed therein; and a cover portion disposed on a rear surface of the main case, configured to be opened and closed, and having a plurality of second through holes formed therein.

2. The wireless communication apparatus of claim 1, wherein a thickness of the upper screen is equal to or larger than twice a diameter of the first through hole.

3. The wireless communication apparatus of claim 1, wherein the plurality of first through holes have a circular or oval cross-section.

4. The wireless communication apparatus of claim 1, wherein the plurality of first through holes are formed to penetrate the upper screen in a direction parallel to a longitudinal direction of the heat dissipation portion.

5. The wireless communication apparatus of claim 1, wherein the plurality of first through holes are formed to penetrate the upper screen at an angle to a longitudinal direction of the heat dissipation portion.

6. The wireless communication apparatus of claim 1, further comprising:

one or more vertical rotation shafts located on at least one of left and right sides of the wireless communication apparatus so that the cover portion is opened and closed by pivoting around the vertical rotation shaft.

7. The wireless communication apparatus of claim 1, wherein at least a portion of the upper screen has a horizontal surface, and at least another portion of the upper screen has a downward slope to the outer side.

8. The wireless communication apparatus of claim 1, further comprising:

a fixing portion configured to fix the cover portion in an opened state when the cover portion is opened.

9. The wireless communication apparatus of claim 8, wherein the fixing portion includes a locking portion configured to fit into an inner wall of the cover portion, the locking portion being formed at a free end.

10. The wireless communication apparatus of claim 1, further comprising:

a handle portion formed to protrude to the outside through at least a portion of the cover portion, wherein an opening corresponding to a disposition position and shape of the handle portion is formed in the cover portion.

11. The wireless communication apparatus of claim 10, wherein the handle portion further includes a handle support portion located on an inner side of the cover portion and disposed to support the position of the handle portion.

12. The wireless communication apparatus of claim 11, further comprising:

a cable disposed between the cover portion and the heat dissipation portion, wherein a portion of the cable is hung on the handle support portion.

* * * * *